US012069798B1

(12) United States Patent
Hand et al.

(10) Patent No.: US 12,069,798 B1
(45) Date of Patent: Aug. 20, 2024

(54) BROADSIDE COUPLED RADIO FREQUENCY INTERCONNECT

(71) Applicant: Lockheed Martin Corporation, Bethesda, MD (US)

(72) Inventors: Thomas Henry Hand, Highlands Ranch, CO (US); Joshua David Gustafson, Castle Rock, CO (US); Joseph M. Torres, Littleton, CO (US); Aaron Christopher Rothlisberger, Littleton, CO (US); Roger Douglas Hasse, Superior, CO (US); Adam Blair Hess, Denver, CO (US); Madison P. Gast, Aurora, CO (US); Braiden T. Olds, Highlands Ranch, CO (US); Colton Brent Martin, Austin, TX (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 211 days.

(21) Appl. No.: 17/726,672

(22) Filed: Apr. 22, 2022

Related U.S. Application Data

(60) Provisional application No. 63/180,330, filed on Apr. 27, 2021.

(51) Int. Cl.
| | |
|---|---|
| *H05K 1/02* | (2006.01) |
| *H01P 5/18* | (2006.01) |
| *H05K 1/14* | (2006.01) |

(52) U.S. Cl.
CPC ............. *H05K 1/024* (2013.01); *H01P 5/187* (2013.01); *H05K 1/145* (2013.01); *H05K 2201/09227* (2013.01)

(58) Field of Classification Search
CPC .................. H05K 1/024; H05K 1/145; H05K 2201/09227; H01P 5/12; H01P 5/187
See application file for complete search history.

(56) References Cited

U.S. PATENT DOCUMENTS

| 11,223,099 | B1 | 1/2022 | Allen | |
|---|---|---|---|---|
| 2005/0002448 | A1* | 1/2005 | Knight | ................ H01L 23/5385 |
| | | | | 375/219 |
| 2014/0085856 | A1* | 3/2014 | Shirao | ..................... H01P 3/003 |
| | | | | 174/254 |
| 2015/0048520 | A1* | 2/2015 | Skinner | ................... H01L 24/16 |
| | | | | 257/777 |
| 2018/0084323 | A1* | 3/2018 | Luce | ........................ H04R 9/06 |

\* cited by examiner

*Primary Examiner* — Hoa C Nguyen

(57) ABSTRACT

Enhanced components and assemblies for connector-less radio frequency (RF) interconnect systems are provided. One example includes two circuit boards each with a broadside coupling feature comprising a tapered circuit board trace having a terminal portion. The circuit boards are positioned in close proximity to establish a desired gap, and a dielectric material is positioned within the gap between circuit boards. The broadside coupling features of the circuit boards are then configured to convey RF signals over the gap without electrical contact.

20 Claims, 7 Drawing Sheets

BROADSIDE COUPLED RADIO FREQUENCY INTERCONNECT

RELATED APPLICATIONS

This application hereby claims the benefit and priority to U.S. Provisional Application No. 63/180,330, titled "PCB-TO-PCB CONNECTORLESS INTERCONNECT," filed Apr. 27, 2021, which is hereby incorporated by reference in its entirety.

TECHNICAL BACKGROUND

Carrying radio-frequency (RF) signals over connectors is employed across a wide range of application areas, including telecommunications, telemetry, aerospace applications, wireless data transmission, digital automation, A/V transmission, surveillance, remote sensing and control, and more. Many solutions exist to carry RF signals, but large-scale interconnects and interposers require complex, expensive designs that are difficult to manufacture and have reliability concerns. Furthermore, complex designs can require many connections, such as press-in connectors or blind mate connections, which need correct alignment and high levels of mating force to be successfully joined.

In connections involving printed circuit boards (PCBs), a standard way to transmit high-frequency RF signals from one PCB to another is by configuring a high-density blind mate configuration. However, as mentioned, blind mate connections are difficult to correctly align, require verification of successful connection, and can cause damage to hardware components if not done properly. In products or designs requiring a high quantity of interconnects for RF transmission, such as electronically steered arrays, designing and assembling connector solutions or interposers presents difficult challenges, while the use of dozens or hundreds of connectors can lead to a significant expense.

OVERVIEW

The examples discussed herein provide contactless or connector-less radio frequency (RF) energy transfer between circuit board traces of circuit boards. This RF energy transfer occurs over a gap between the circuit boards via broadside coupling features of terminal portions of the circuit board traces. The broadside coupling features are aligned in proximity such that the energy can be transmitted/received at wide bandwidths with low loss. Also, enhanced structures of both the broadside coupling features and conductive plane layers of the circuit boards can be used to achieve a desired footprint while maintaining desired operating characteristics, such as impedance and bandwidth. Example systems which can employ such planar-to-planar signal couplers include electronically steered arrays (ESAs), phased array systems, or other antenna arrays fed by waveguides and transmit/receive circuitry and connectors coupled to circuit boards. For instance, circuit boards can comprise thousands of broadside coupling features to provide a connector-less interconnect for arrayed antenna systems. Such a connector-less interconnect can decrease costs, reduce assembly and manufacturing risks, and provide mass-producible, high-performance RF interfaces, among other benefits.

One example implementation includes an apparatus comprising broadside coupling features comprising circuit board traces having terminal portions configured to convey radio frequency signals over a gap between the terminal portions and a dielectric material positioned within the gap.

Another example implementation includes a system. The system comprises a first circuit board with a broadside coupling feature comprising a first circuit board trace having a first terminal portion and a second circuit board with a broadside coupling feature comprising a second circuit board trace having a second terminal portion. The system further comprises a dielectric material positioned within a gap between the first terminal portion and the second terminal portion. The broadside coupling features of the first circuit board and the second circuit board are configured to convey radio frequency signals over the gap.

In yet one more example, another system is provided. The system comprises circuit boards separated by a gap and a dielectric material positioned within the gap. Each of the circuit boards comprise an array of broadside coupling features comprising circuit board traces having terminal portions configured to convey radio frequency signals over the gap between the terminal portions and magnetic elements configured to magnetically couple and planarly align corresponding pairs of broadside coupling features of the circuit boards.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Discussed herein are enhanced components and assemblies related to radio frequency (RF) coupling between circuit boards via connector-less interfaces. Often, interconnect between circuit boards encompasses connectors of various types. In the realm of RF interconnect, especially high-frequency (e.g., microwave) interconnect, bulky and expensive connectors are often employed. When large arrays of antennas are formed, such as steered arrays, the quantity of connectors can number in the hundreds or thousands. This large quantity produces large part counts, costs, and weight characteristics. Advantageously, the interconnect features described herein can reduce or eliminate discrete RF connectors used to couple RF signals between circuit boards.

One example includes broadside coupling features comprising circuit board traces having terminal portions that convey RF signals over a gap. The circuit board traces can correspond to separate circuit boards in a planar-to-planar configuration. While in this planar-to-planar configuration, the terminal portions of broadside couplers can be aligned in proximity and along several axes. Alignment in proximity can refer to a desired distance, stackup, or gapping between broadside coupling features, while other alignments can be achieved, including axial rotational and planarity alignments. Moreover, within each of the separate circuit boards, conductive plane layers and vias can be shaped/sized to form an embedded isolation structure surrounding at least a portion of the broadside coupling features to produce desired output characteristics, such as a target impedance and bandwidth. In large arrays of antenna elements and RF transmit/receive circuitry, such as ESAs or other arrays, many broadside coupling features can function as "connector-less" circuit board interconnect to feed RF interposer and waveguide components that ultimately couple RF signaling to antenna elements.

Figure 1:
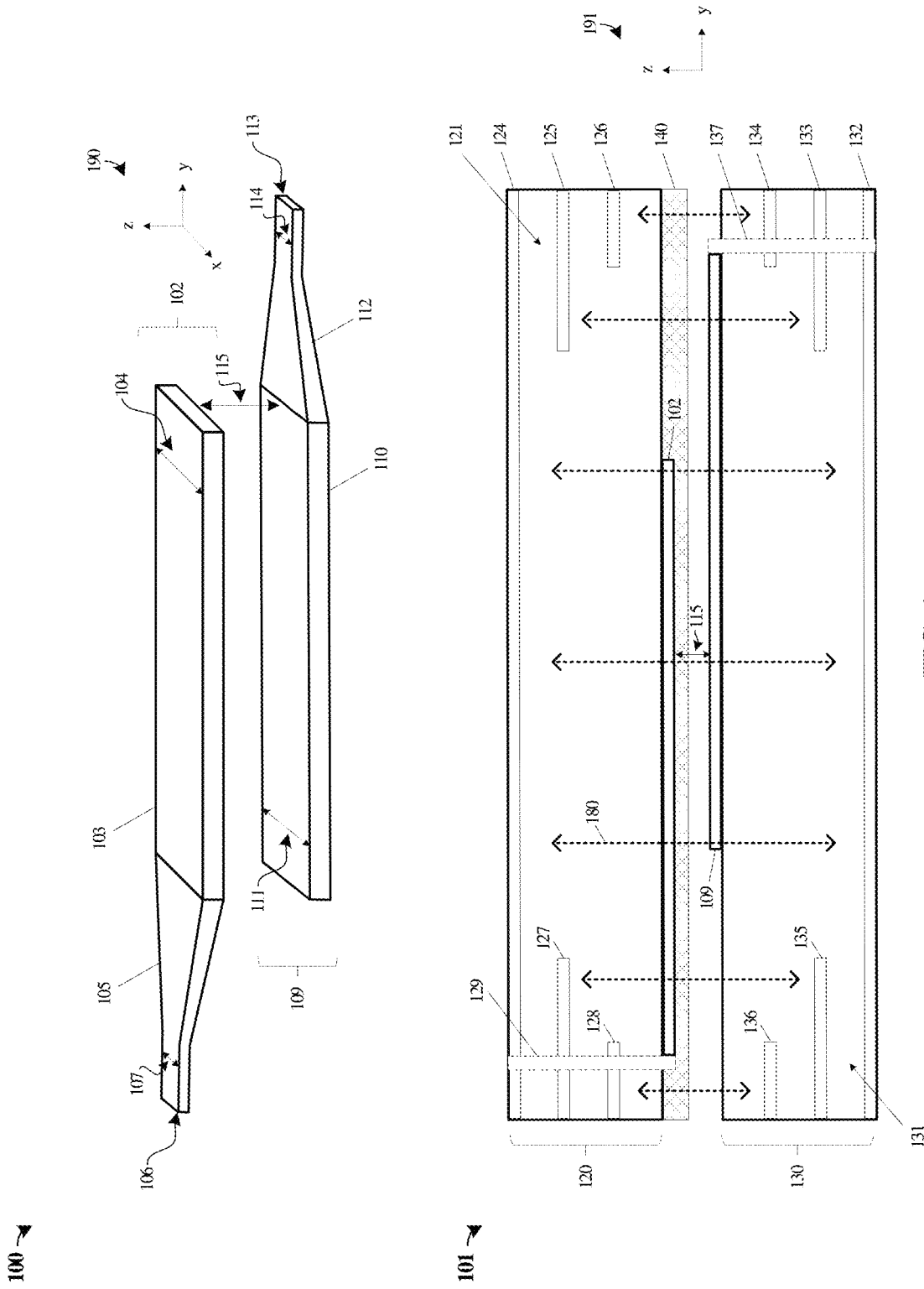
FIG. 1 illustrates example aspects of broadside coupling features and circuit boards employing broadside coupling features in an implementation.

Turning now to the Figures, FIG. 1 includes views 100 and 101 that illustrate various aspects of broadside coupling features with respect to associated circuit boards. View 100 is an isometric view, in reference to coordinate frame 190, that illustrates broadside coupling feature 102 and broadside coupling feature 109, which are separated by gap 115. In view 100, broadside coupling features 102 and 109 are shown in isolation from circuit boards and without any intervening dielectric layer for clarity. Terminal portion 103 of broadside coupling feature 102 is shown positioned directly over and in parallel with terminal portion 110 of broadside coupling feature 109 without physical connection to each other. In terms of coordinate frame 190, terminal portions 103 and 110 are positioned to be aligned along the x-y axes while maintaining planarity in the z-axis.

View 101 is a cross-sectional side view, in reference to coordinate frame 191, that illustrates broadside coupling feature 102 on circuit board 120 and broadside coupling feature 109 on circuit board 130. When positioned in proximity (i.e., within a desired distance between broadside coupling features), broadside coupling features 102 and 109 can convey RF signals from one to the other. Each of circuit boards 120 and 130 comprise various elements shown and are separated by gap 115 and a dielectric layer 140 is disposed within gap 115.

Broadside coupling features 102 and 109 comprise conductive circuit board traces having corresponding shaped or tapered features, although some examples may lack the shaping/tapering. Broadside coupling features 102 and 109 can comprise one among microstrips, embedded microstrips, or embedded striplines. Each broadside coupling feature comprises a tapered configuration having a terminal portion (103, 110) forming a signal coupling feature, with a feed trace (106, 113) coupled to a tapered section (105, 112) expanding from the feed trace to the terminal portion. Broadside coupling feature 102 has a terminal portion having width 104 and feed trace 106 having width 107. Feed trace 106 is coupled to terminal portion 103 via tapered section 105. Broadside coupling feature 109 includes terminal portion 110 having width 111 and feed trace 113 having width 114. Feed trace 113 is coupled to terminal portion 110 via tapered section 112. Widths 104 and 111 typically have the same dimensions and are selectively wider than feed traces 106 and 113 to affect RF coupling across gap 115. The dimensions of broadside coupling features 102 and 109 and each element thereof can be selected based on desired operating characteristics.

In an example operation, feed trace 113 can be configured to obtain RF signals from a signal source and propagate it through tapered section 112 to terminal portion 110. Terminal portion 110 can convey the RF signals over gap 115 to terminal portion 103 for propagation through tapered section 105 to feed trace 106. Feed trace 106 can pass the RF signals to further circuitry (not shown), such as RF transmit/receive circuitry.

Turning now to view 101, each circuit board 120 and 130 comprises core/substrate layers, conductive layers, circuit trace layers, solder mask layers, labeling, and vias, among other elements. Circuit board 120 comprises broadside coupling feature 102, substrate 121, conductive plane layers 124, 125, 126, 127, and 128, and signal via 129. Circuit board 130 comprises broadside coupling feature 109, substrate 131, conductive plane layers 132, 133, 134, 135, and 136, and signal via 137.

Dielectric layer 140 comprises dielectric material and is disposed within gap 115. Dielectric layer 140 can be of a selected thickness which might span the entirety of, or only a portion of, gap 115 between broadside coupling features 120 and 109. In some examples, dielectric layer 140 is applied on top of one or more of broadside coupling features 102 and 109. Other examples have broadside coupling features 102 or 109 at least partially embedded into the material of dielectric layer 140. Although a particular configuration of dielectric layer 140 is shown in view 101, it should be understood that other configurations are possible.

The conductive plane layers of each circuit board can have staggered window cutouts of decreasing size with relation to the broadside coupling feature of the corresponding circuit board. Conductive plane layers 126 and 128 of circuit board 120 have larger cutouts than conductive plane layers 125 and 127 and conductive plane layer 124, which may not have any cutout portion. Likewise, conductive plane layers 134 and 136 have larger cutouts than conductive plane layers 133 and 135 and conductive plane layer 132, which may also be a layer without a cutout. These cutouts form an isolation structure embedded within each of the separate circuit boards, and can be employed to maintain target impedances for broadside coupling features 102 and 109, as well as reduce cross-talk or cross-coupling between individual instances of broadside coupling features when many are employed on a common circuit board. When circuit boards 120 and 130 are positioned together, as illustrated in view 101, the conductive plane layers of each can form a Faraday cage-like isolation structure in combination with layer-spanning vias (as shown in other Figures).

Using signal vias, traces, and signal routes, RF signals can be passed from one layer of a circuit board to the broadside coupling feature for propagation across gap 115. Signal vias can span from one external layer of the circuit board to another external layer, from one external layer to an internal layer, from one internal layer to another internal layer, or any combination thereof. For instance, signal via 129 can provide a connection to broadside coupling feature 102 from another layer of circuit board 120, and signal via 137 can provide a connection to broadside coupling feature 109 from another layer of circuit board 130. By way of example, broadside coupling feature 109 can be connected to RF circuitry through signal via 137, and broadside coupling feature 102 can be connected through signal via 129 to further elements that are coupled to a waveguide interface or polarizer that ultimately feed an antenna array element. Accordingly, RF signals can be carried to broadside coupling feature 109, conveyed across gap 115 and dielectric layer 140 to broadside coupling feature 102. When circuit boards 120 and 130 are stacked and aligned together, these features function as a contactless or connector-less interconnect between various RF components of a transmitter or receiver.

Circuit boards 120 and 130 typically comprise printed circuit boards (PCBs) and each element thereof can vary in size/dimension and materials to operate and meet packaging constraints as desired. The circuit boards may employ one or more types of conductive circuit board traces or materials, such as copper, silver, gold, aluminum, or another conductive material, including various alloys and solder types once populated with circuit components. Dielectric layer 140 can be formed from various dielectric materials, such as FR4, RT Duroid, Rogers RO, Polytetrafluoroethylene (PTFE), or the like. Different material compositions, thicknesses, lengths, widths, arrangements, and shapes of the isolation features, such as gap 115, signal vias 129 and 137, conductive plane layers, substrates 121 and 131, and dielectric layer 140 can also be selected to alter or suit desired operating characteristics, such as bandwidth and impedance.

In various examples of assemblies of elements shown in FIG. 1, broadside coupling features 102 and 109 are one set among many. Once each circuit board trace is coupled with a circuit board and isolated by conductive plane layers, among other elements, further circuit board traces and conductive plane layers with accompanying signal vias can be coupled nearby or next to the broadside coupler on the same or an adjacent circuit board. Each additional broadside coupling feature can be positioned and planarly aligned with another opposite broadside coupling feature such that each set of broadside coupling features are spaced the same distance apart and form broadside-coupled sets. Accordingly, the circuit boards carrying the plurality of broadside coupling features can also be planarly and axially aligned to ensure consistent spacing and to minimize losses in RF emission transfer across broadside-coupled sets.

View 101 also shows example coupling field vectors 180, which can include fringing field effects. The effect of the windowing of layers of the accompanying circuit boards can be seen with a high coupling among terminal ends, and a lower coupling tapering off for the feed structures due to the windowing features. To further enhance operation of the coupling, a high dielectric constant (Dk) core material can be employed for the circuit board layers. This core material, along with the ground plane windowing and tapering of the broadside coupling features can yield excelling coupling. For the dimensions discussed herein, the coupling can be for a band of 4-18 GHz with an insertion loss ~0.25 dB across the band. The use of higher dielectric core material can concentrate the coupling fields within the coupling region defined by the terminal ends and the windowed ground plane. Example high dielectric constant core material includes Rogers RO 3006 with a Dk=6.15, although other materials are suitable. The ground plane windowing allows for a balance between coupling dimensions, impedance control, and efficient use of space for the coupling features, and also allows broadside couplers to achieve a required footprint size while still providing for 50 ohm traces to be used to route signals to the broadside couplers.

Figure 2:
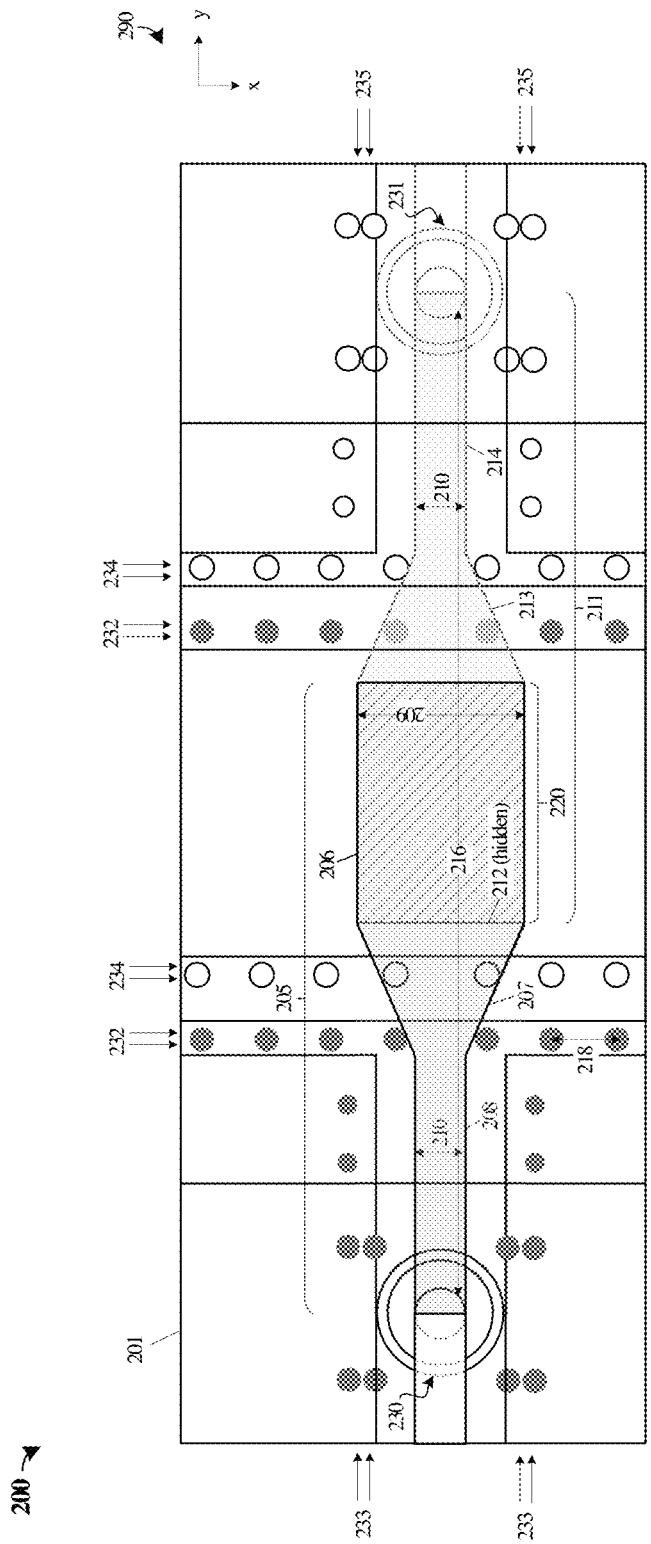
FIG. 2 illustrates an example aspect of broadside coupling features and accompanying circuit board features used in an implementation.

FIG. 2 includes view 200 that illustrates components of a circuit board and broadside-coupled traces. View 200 is an overhead view that illustrates circuit board assembly 201, broadside coupling feature 205, broadside coupling feature 211, and isolation vias 217 in reference to coordinate frame 290. Broadside coupling feature 205 comprises terminal portion 206, tapered section 207, and feed trace 208. Broadside coupling feature 211 comprises terminal portion 212, tapered section 213, and feed trace 214.

Circuit board assembly 201 comprises two or more circuit boards planarly aligned and placed in proximity. The view of FIG. 2 shows a semi-transparent overhead view through two circuit boards, and some elements may be underneath others or occluded from view. The elements of circuit board assembly 201 are thus included on or embedded in one or more layers of the circuit boards. Broadside coupling feature 205 may reside on one layer of a circuit board (an internal or external layer) of circuit board assembly 201 while broadside coupling feature 211 may reside on a layer of another circuit board of circuit board assembly 201. Alternatively, circuit board assembly 201 may comprise a single multi-layered circuit board with broadside coupling features 205 and 211 residing on different or embedded layers of the circuit board.

While typically on layers of separate circuit boards of circuit board assembly 201, terminal portion 206 of broadside coupling feature 205 is positioned over and in parallel with terminal portion 212 of broadside coupling feature 211 such that the terminal portions align in the x-y plane with respect to coordinate frame 290. In this positioning, the terminal portions 206 and 212 form overlap 220 (shaded), which relates to an RF coupling area. In several instances, terminal portions 206 and 212 comprise the same width, width 209, to avoid any overshoot or undershoot of the aligned elements. However, other widths or positioning (e.g., amount of overlap) of the broadside coupling features can be contemplated based on desired operating characteristics.

Broadside coupling features 205 and 211 also comprise feed traces coupled with respective terminal portions via tapered sections. Feed trace 208 is coupled to terminal portion 206 via tapered section 207, and feed trace 214 is coupled to terminal portion 212 via tapered section 213. Tapered sections 207 and 213 expand width 210 of the feed traces to width 209 of the terminal portions. In various implementations, width 210 may be approximately 20 mm, width 209 may be approximately 65 mm, and width 216 of the assembly of broadside coupling features 205 and 211 may be approximately 290 mm. Typically, feed traces 208 and 214 have the same width, width 210, which is smaller than width 209 of terminal portions 206 and 212. Advantageously, having wider terminal portions 206 and 212 can affect RF coupling and reduce losses and noise, among other characteristics. Each width, length, or other dimension of the feed traces, tapered sections, and broadside coupling features may be different than illustrated or discussed herein and can be selected based on desired operating characteristics.

Various isolation vias are included in assembly 201. Since two circuit boards are typically employed, each will have accompanying via structures which are largely similar. However, for the discussion of FIG. 2, various features will be categorized according to the respective broadside coupling feature. For broadside coupling feature 205, a first set of isolation vias comprises intercoupler shield vias 232 and a second set of isolation vias comprises stripline feed shield vias 233. For broadside coupling feature 220, a first set of isolation vias comprise intercoupler shield vias 234 and a second set of isolation vias comprises stripline feed shield vias 235. Intercoupler shield vias can couple between ground planes of the corresponding circuit board to form a shield or isolation structure that reduces crosstalk and interference among terminal ends of adjacent broadside coupling features that reside on the same circuit board. Stripline feed shield vias can shield feed lines as the feed lines enter the broadside coupling feature from an accompanying RF signal via, and can improve return and insertion losses while reducing signal leakage into the PCB substrate. Each of the intercoupler shield vias for a particular via set may having equidistant spacing 218 (e.g., approximately 25 mm). Additional vias can carry RF signals to and from a corresponding broadside coupling feature. In an instance, feed trace 214 of broadside coupling feature 211 can be connected to RF signals through signal via 231, and feed trace 208 of broadside coupling feature 205 can be connected to RF signals through signal via 230. Accordingly, RF signals can be conveyed between broadside coupling feature 211 and broadside coupling feature 205 across a gap. Other vias, routes, and traces can function to provide a connection to one of the broadside coupling features from another layer of a circuit board of circuit board assembly 201, among other elements of circuit board assembly 201.

Though only a single pair or set of mating broadside coupling features and surrounding isolation vias are illustrated in FIG. 2, various implementations provide for a large array of many broadside-coupled sets, each individually coupled to RF antenna interface elements and RF transmit/receive circuitry. Each set or pair of broadside coupling features and the corresponding circuit boards can further be positioned to ensure a consistent gap and alignment exists between each set. Consistent spacing and alignment between the broadside coupling features may help minimize losses in RF signal transfer and maintain a target impedance, among other benefits.

Figure 3:
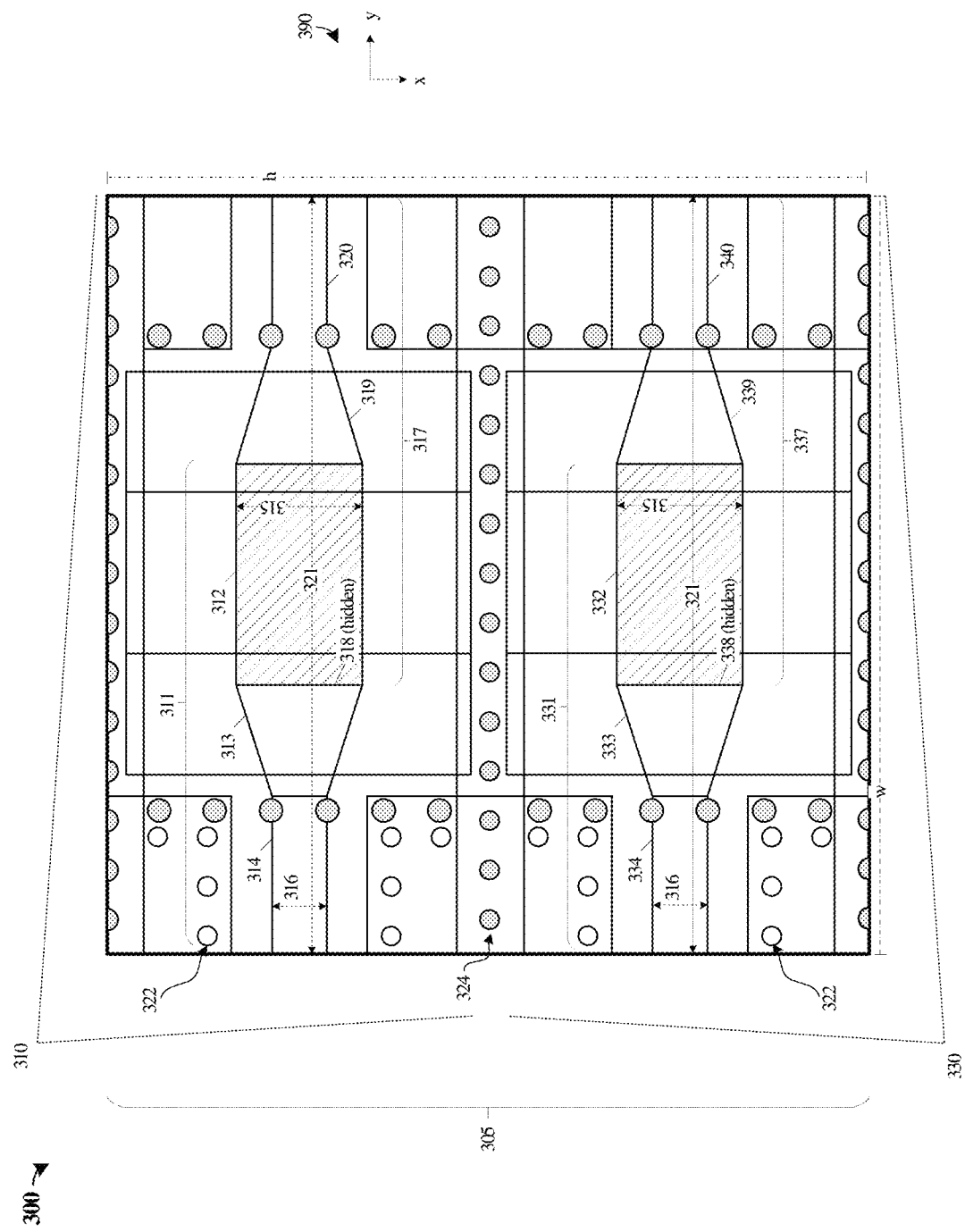
FIG. 3 illustrates example aspects of a system employing circuit boards with broadside coupling features for radio frequency coupling used in an implementation.

FIG. 3 includes view 300 that illustrates components of a circuit board assembly and more than one set of broadside coupling features. View 300 is an overhead view that illustrates circuit board assembly 305 with two pairs of accompanying broadside coupling features in reference to coordinate frame 390. RF coupling set 310 includes broadside coupling feature 311 and broadside coupling feature 317. RF coupling set 330 includes broadside coupling feature 331 and broadside coupling feature 337. Also, various isolation vias are included in assembly 305, discussed below.

The configuration shown in FIG. 3 might be employed to accommodate a dual linear orthogonal antenna element configuration. This can be employed in ESAs or other arrays which have pairs of signals having orthogonal polarizations or dual-channels per antenna element. In one example, the dimensions of the broadside coupling features in FIG. 3, namely width (w) and height (h) can be 8.6 mm to support signals of 4-18 GHZ. In such configurations, set 310 might correspond to a first channel or first polarization, and set 330 might correspond to a second channel or second polarization.

Circuit board assembly 305 comprises two or more circuit boards planarly and axially aligned and placed in proximity. In various implementations, RF coupling sets 310 and 330 are adjacently positioned on circuit board assembly 305. Such positioning and distribution on circuit board assembly 305 can provide spacing between each of the RF coupling assemblies allowing for signal isolation between the RF coupling assemblies and the elements thereof. Intercoupler shield vias 324 may also be included within circuit board assembly 305, which may provide further isolation between the two assemblies.

The elements of RF coupling sets 310 and 330 are on or embedded in one or more layers of the circuit boards of circuit board assembly 305. Broadside coupling feature 311 of circuit board set 310 may reside on one layer of a circuit board (an internal or external layer) of circuit board assembly 305 while broadside coupling feature 317 may reside on a layer (internal or external layer) of another circuit board of circuit board assembly 305. Broadside coupling feature 331 of RF coupling set 330 may reside on the same layer of a circuit board as broadside coupling feature 311. Likewise, broadside coupling feature 337 may reside on the same layer of another circuit board as broadside coupling feature 317. Alternatively, circuit board assembly 305 may comprise one multi-layered circuit board, and the elements of RF coupling sets 310 and 330 can reside on different or embedded layers of the circuit board.

Each of the broadside coupling features of circuit board assembly 305 comprises a terminal portion, a tapered section, and a feed trace. Broadside coupling feature 311 comprises terminal portion 312, tapered section 313, and feed trace 314. Broadside coupling feature 317 comprises terminal portion 318 (hidden), tapered section 319, and feed trace 320. Broadside coupling feature 331 comprises terminal portion 332, tapered section 333, and feed trace 334. Broadside coupling feature 337 comprises terminal portion 338 (hidden), tapered section 339, and feed trace 340. While typically on layers of separate circuit boards of circuit board assembly 305, terminal portion 312 of broadside coupling feature 311 is positioned over and in parallel with terminal portion 318 of broadside coupling feature 317 such that the terminal portions align in the x-y plane with respect to coordinate frame 390. In this positioning, the terminal portions 312 and 318 form an overlap (shaded portion), which may relate to an RF coupling area. Similarly, terminal portion 332 of broadside coupling feature 331 is positioned over and in parallel with terminal portion 338 of broadside coupling feature 337 forming another overlap of the two terminal portions in the x-y plane with respect to coordinate frame 390. In several instances, terminal portions 312, 318, 332, and 338 comprise the same width, width 315, to avoid any overshoot or undershoot of the aligned elements. However, other widths or positioning (e.g., amount of overlap) of the broadside coupling features can be contemplated based on desired operating characteristics.

Broadside coupling features 311, 317, 332, and 338 also comprise feed traces coupled with respective terminal portions via tapered sections. Within RF coupling set 310, feed trace 314 of broadside coupling feature 311 is coupled to terminal portion 312 via tapered section 313, and feed trace 320 of broadside coupling feature 317 is coupled to terminal portion 318 via tapered section 319. Within RF coupling set 330, feed trace 334 of broadside coupling feature 331 is coupled to terminal portion 332 via tapered section 333, and feed trace 340 of broadside coupling feature 337 is coupled to terminal portion 338 via tapered section 339. Tapered sections 313, 319, 333, and 339 expand width 316 of the feed traces to width 315 of the terminal portions. In various implementations, width 316 may be approximately 20 mm, width 315 may be approximately 65 mm, and width 321 of the assemblies of broadside coupling features 311 and 317 and broadside coupling features 331 and 337 may be approximately 290 mm. Typically, the feed traces have the same width, width 316, which is smaller than width 315 of the terminal portions. Advantageously, having wider terminal portions can affect RF coupling and reduce losses and noise, among other characteristics. Each width, length, or other dimension of the feed traces, tapered sections, and broadside coupling features may be different than illustrated or discussed herein and can be selected based on desired operating characteristics.

Some elements of circuit board assembly 305, like stripline feed shield vias 322 and intercoupler shield vias 324 can span multiple layers of a circuit board of circuit board assembly 305. The various isolation features include stripline feed shield vias 322 and intercoupler shield vias 324. The use of intercoupler shield vias 324 can improves isolation between vertically/horizontally adjacent RF coupling sets and diagonally-adjacent RF coupling sets. Stripline feed shield vias 322 can improve return and insertion losses, and reduce signal leakage into the PCB substrate. Thus, stripline feed shield vias 322 can provide isolation for feed traces 314, 320, 334, and 340, and intercoupler shield vias 324 can provide isolation for broadside coupling features 311, 317, 331, and 337. It should be noted that the stripline feed shield vias and intercoupler shield vias associated with broadside coupling features 317 and 337 are not shown in FIG. 3 for clarity in showing the vias associated with broadside coupling feature 311 and 331. Other signal vias (not shown) can function to provide a connection to one of the broadside coupling features from another layer of a circuit board of circuit board assembly 305, among other elements of circuit board assembly 305. Each of intercoupler shield vias 324 surrounding respective broadside coupling features may comprise equidistant spacing (e.g., approximately 25 mm).

In an instance, feed trace 320 of broadside coupling feature 317 can be connected to RF circuitry through a signal via (not shown), and feed trace 314 of broadside coupling feature 311 can be connected to RF interfacing features that feed a waveguide or polarizer through another signal via (not shown). Accordingly, RF signals can be conveyed from broadside coupling feature 317 to broadside coupling feature 311 across a gap between terminal portions 312 and 318. While not fully described for the sake of brevity, broadside coupling features 331 and 337 can be configured to perform in the same or a similar manner as broadside coupling features 311 and 317, thus creating another broadside-coupled set of signal couplers within circuit board assembly 305.

Though only two RF coupling assemblies and surrounding signal vias are illustrated in FIG. 3, various implementations provide for a large array RF coupling assemblies having broadside-coupled sets, each individually coupled to RF antenna interface elements and RF transmit/receive circuitry using accompanying signal vias. Each set of broadside coupling features and the corresponding circuit boards can further be positioned to ensure a consistent gap and alignment exists between each set. Consistent spacing and alignment between the broadside coupling features may help minimize losses in RF signal transfer and maintain a target impedance, among other benefits.

Figure 4:
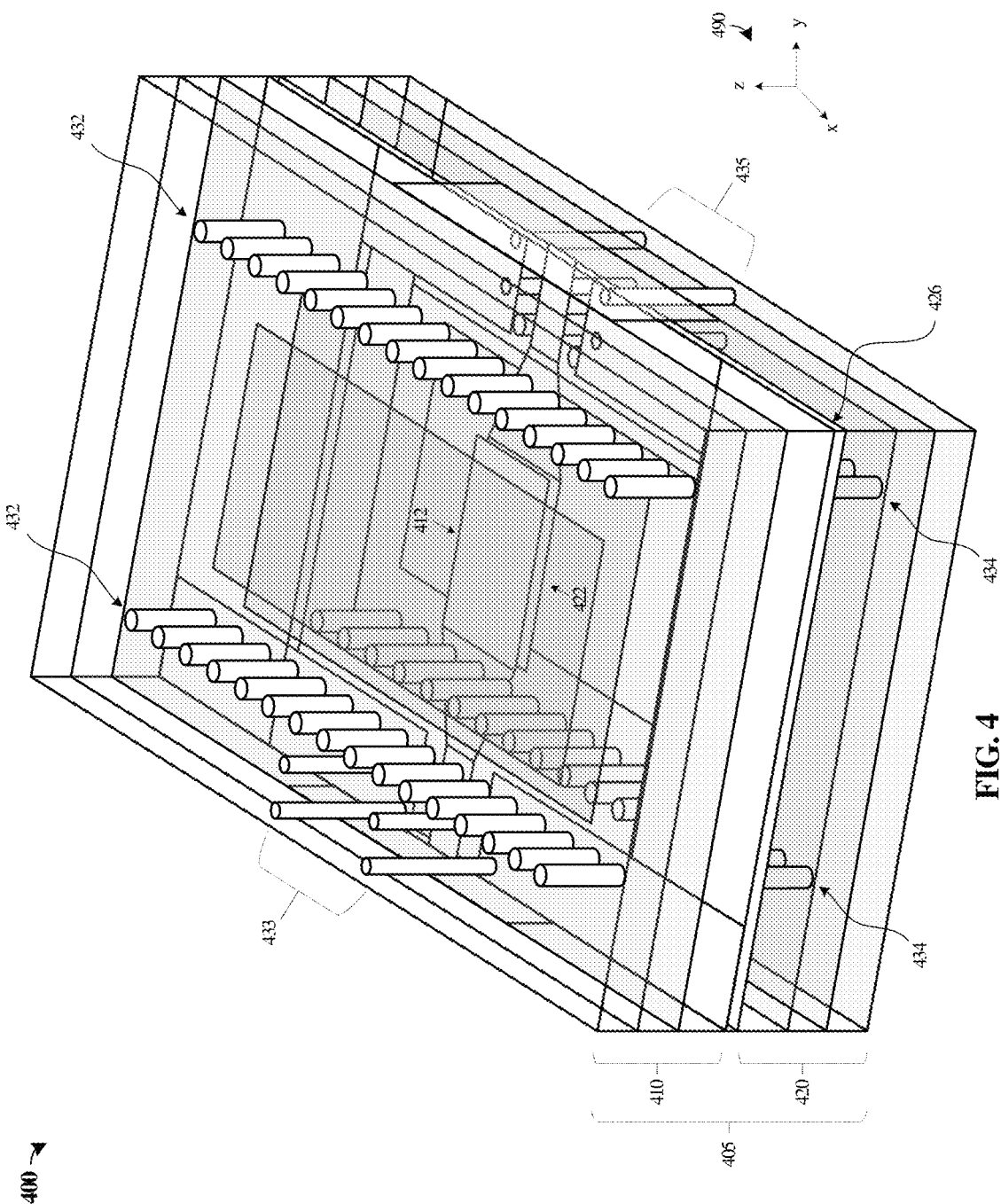
FIG. 4 illustrates an example system employing circuit boards with broadside coupling features for radio frequency coupling used in an implementation.

FIG. 4 includes partially-transparent wireframe isometric view 400. View 400 illustrates an example system featuring any of the previously mentioned components, although variations are possible. View 400 includes assembly 405 comprising circuit boards 410 and 420 with broadside coupling features 412 and 422 configured to convey RF signals from one to the other. Coordinate frame 490 is included for reference.

Circuit boards 410 and 420 comprise multi-layer printed circuit boards that are planarly aligned in the x-y plane and rotationally aligned about the z-axis. Each of circuit boards 410 and 420 comprises substrate layers, conductive layers, circuit trace layers, solder mask layers, labeling, and signal vias, among other elements. Circuit board 410 includes broadside coupling feature 412 and isolation vias 432-433. Circuit board 420 includes broadside coupling feature 422 and isolation vias 434-435, some of which are partially hidden from view. Broadside coupling features 412 and 422 can be located on external layers of circuit boards 410 and 420, respectively, or can be embedded in internal layers. Regardless of layer positioning of the broadside coupling features, a selected gap 426 is established between the broadside coupling features. A dielectric layer comprising dielectric material can be disposed within the gap, a thickness of which can be selected based on desired operating characteristics.

Each broadside coupling feature comprises a wide terminal portion forming signal coupling features and a feed trace coupled with a tapered section expanding from the feed trace to the terminal portion of the broadside coupling feature. Typically, the terminal portions of the broadside coupling features have the same dimensions and are selectively wider than the feed traces to affect RF propagation across the gap between circuit boards 410 and 420. When the terminal portions (and associated circuit boards) of broadside coupling features 412 and 422 are aligned in a broadside-coupled arrangement, the coupled set can operate with a wide footprint without overshoot or undershoot of associated terminal portions.

Each feed trace can be configured to carry RF signals to/from the broadside coupling features by signal vias on each separate circuit board. Isolation vias 432-433 of circuit board 410 span one or more layers of circuit board 410, and isolation vias 434-435 of circuit board 420 span one or more layers of circuit board 420. In an instance, additional vias (not shown) can be configured to carry an RF signal from RF components of circuit board 420 to the feed trace of broadside coupling feature 422. Broadside coupling feature 422 can then be configured to convey the RF signal across the gap between the terminal portions to broadside coupling feature 412. The feed trace of broadside coupling feature 412 can pass the RF signal to RF components of circuit board 410. In various instances, isolation vias of circuit boards 410 and 420 may be spaced equidistantly from each other in a pattern surrounding corresponding broadside coupling features and feed traces to provide isolation for the corresponding broadside coupling features and feed traces. The spacing and dimensions of the isolation vias and the quantity thereof can be selectively chosen based on desired operating characteristics of circuit board assembly 405 and elements thereof.

Figure 5:
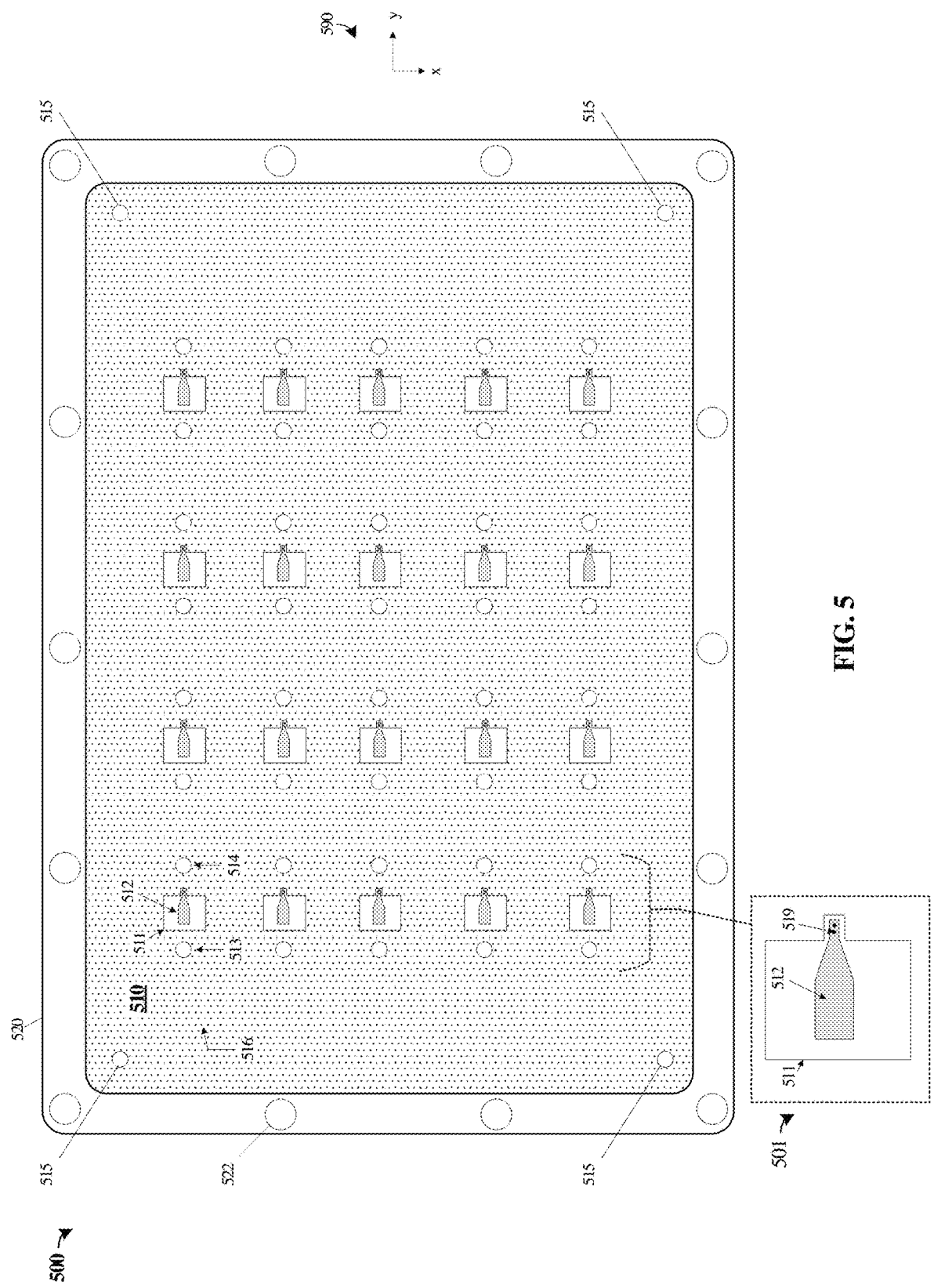
FIG. 5 illustrates an example aspect of a circuit board and enclosure elements used in an implementation.

FIG. 5 includes view 500, which illustrates circuit board 510 along with various connector, attachment, and enclosure features. View 500 is an overhead view of circuit board 510, in reference to coordinate frame 590, which includes a plurality of broadside coupling features (e.g., broadside coupling feature 512), magnetic elements (e.g., magnetic elements 513 and 514), and alignment pins 515. Detailed inset 501 shows a detailed view of elements of one example broadside coupling element. Circuit board 510 can be affixed to enclosure element 520, which includes a further plurality of magnetic elements (e.g., magnetic element 522). Due in part to the various alignment and magnetic features discussed in FIG. 5, when circuit board 510 and another circuit board are coupled together, pairs of broadside coupling features of each circuit board are planarly and axially aligned and coupled together without physical connectors or conductive touching. Also, the pairs of broadside coupling features can have a consistent amount of space or gapping as noted herein. Each pair of broadside coupling features can thus be configured to convey RF signals across a gap between the two separate circuit boards.

In view 500, external layer 516 of circuit board 510 is shown, which may embody an external layer of any of the circuit boards of the preceding figures. The external layer of circuit board 510, as illustrated, includes a number of broadside coupling features, each of which is a conductive circuit board trace having corresponding shaped/tapered features surrounded by a cutout from the conductive material of layer 516. Inset view 501 shows a magnified view of such features, including signal vias 519. Each of the broadside coupling features can comprise one among microstrips, embedded microstrips, embedded striplines, or the like, having a wide terminal portion forming signal coupling features and a feed trace. Although not required, the feed trace portion can couple to a tapered section expanding from the feed trace to the terminal portion of the broadside coupling feature. The broadside coupling features are configured to propagate RF signals to other mating broadside coupling features (not shown). The RF signals may be obtained from a layer of circuit board 510. Thus, when circuit board 510 is stacked and aligned with another circuit board, the broadside coupling features of the circuit boards function as a contactless or connector-less interconnect.

In various instances, the broadside coupling features are distributed over the external layer of circuit board 510. Not only does the spacing between each feature provide signal isolation, but also isolation vias associated with each broadside coupling feature can be arranged to shield an associated feature from other nearby features on circuit board 510. Additionally, circuit board 510 can comprise conductive plane layers having windowed cutouts of changing size with relation to the broadside coupling features. These cutouts can also form an isolation structure around each broadside coupling feature, and in turn, can be employed to maintain target impedances for the broadside coupling features.

In various implementations, circuit board 510 can be coupled with another circuit board having a similar shape and exterior layer design (not shown), such that each broadside coupling feature of circuit board 510 planarly aligns with a corresponding broadside coupling feature of the other circuit board. To ensure that each of the broadside coupling features are aligned properly and without axial rotation of the terminal portions, circuit board 510 comprises a plurality of magnetic elements located near each broadside coupling feature of circuit board 510. For example, magnetic elements 513 and 514 can be located on opposite longitudinal sides of broadside coupling feature 512. On the mating circuit board, a further plurality of magnetic elements can be included in the same positions as the magnetic elements of circuit board 510 to form complementary pairs of magnets configured to align and maintain positioning between the broadside coupling features of circuit board 510 and the broadside coupling features of the mating circuit board. Magnetic elements 513 and 514 can ensure planarity between mating broadside coupling features and establishment of a consistent selected gap between mating broadside coupling features by reducing the effects from circuit board irregularities and flex across the surface area of the circuit board. In various examples, the magnetic elements may comprise various rare-earth magnets, such as neodymium magnets, samarium-cobalt magnets, or another type of magnetic material. Advantageously, the use of such magnetic elements can decrease the risk of blind-mating error, decrease assembly time and cost, and reduce a quantity of through-hole fasteners required, such as screws, inserts, or standoffs, including any associated extruded cuts or holes on the circuit board requiring more complicated manufacturing techniques and circuit layout and routing.

View 500 also includes enclosure element 520, which can be coupled with circuit board 510 by various attachment features to shield internal components from external environments. In various instances, enclosure element 520 can comprise a case, protective cover, or RF shielding assembly or clamshell, and may be formed out of metal, plastic, fiberglass, or some composite or other material which can have conductive material applied thereto. Structurally, enclosure element 520 can comprise alignment pins 515 located along outer portions of enclosure element 520. Each alignment pin can be inserted into a hole or cavity of circuit board 510 to physically align and hold circuit board 510 in place within enclosure element 520. Enclosure element 520 also comprises a plurality of magnetic elements, such as magnetic element 522. Following the example described above where another circuit board is stacked on circuit board 510, enclosure element 520 can be coupled with an enclosure element of the other circuit board via magnetic elements to enclose and protect the two separate circuit boards. Other alignment and coupling mechanisms between the enclosure elements can also be considered, such as alignment pins, fasteners, clasps, adhesives, or the like. Gasketing can be included between portions or halves of enclosure elements when mated, such as electromagnetic interference (EMI) seals or environmental gaskets.

Figure 6:
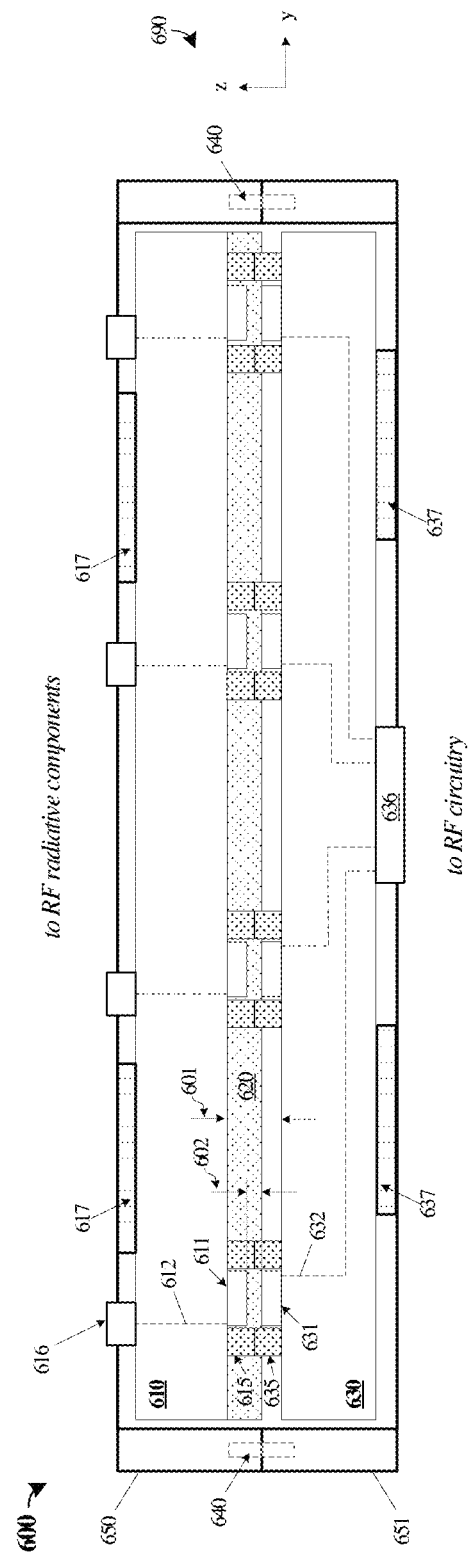
FIG. 6 illustrates an example system employing circuit boards with broadside coupling features and attachment features for alignment and protection used in an implementation.

To further illustrate mating between circuit boards and enclosure elements, FIG. 6 is presented. FIG. 6 includes view 600, which illustrates a system capable of RF coupling between circuit boards via connector-less interfaces using broadside coupling techniques. View 600 is a side view of circuit boards 610 and 630 and references coordinate frame 690. Circuit boards 610 and 630 are each mounted to enclosure elements 650 and 651, respectively, and placed in proximity to one another and are separated by separation distance 601, which includes broadside coupling gap 602. In this configuration, broadside coupling elements of circuit boards 610 and 630 can convey RF signals over gap 602.

Circuit boards 610 and 630 form an assembly that provides contactless or connector-less interconnect capable of carrying RF signals from RF radiative components to/from RF transmit/receive circuitry. Although a simplified arrangement is shown in FIG. 6, it should be understood that each circuit board might have on-board circuitry and components that couple over broadside connectors. For example, connector 636 of circuit board 630 can include a high-density arrangement that carries RF signals from RF circuitry, and circuit board 630 fans-out the high-density connection to a low-density arrangement for distribution of the RF signals to an array of horn antennas fed by waveguides, filters, or polarizer elements. Connectors 616 of circuit board 610 might then couple to such waveguides, filters, or polarizer elements or interposer elements to ultimately emit radiated RF signals into those components. Elements of FIG. 6 can thus act as a conductive-to-radiative adapter assembly, using connector-less features to reduce a connector part count between one circuit board generally associated with RF circuitry interfacing and one circuit board generally associated with RF radiative component interfacing.

Circuit boards 610 and 630 each comprise substrate layers, conductive layers, circuit trace layers, solder mask layers, labeling, and vias, among other elements. Circuit board 610 comprises several broadside coupling features (e.g., broadside coupling feature 611), with corresponding vias (e.g., signal via 612), and magnetic elements (e.g., magnetic element 615). Circuit board 630 also comprises several broadside coupling features (e.g., broadside coupling feature 631) with corresponding signal routes and vias (e.g., signal route 632) and magnetic elements (e.g., magnetic element 635).

The broadside coupling features of circuit boards 610 and 630 are conductive circuit board traces having corresponding shaped features. For example, broadside coupling features 611 and 631 can comprise one among microstrips, embedded microstrips, or embedded striplines. As such, the broadside coupling features can be on external layers of circuit boards 610 and 630 or within internal layers of the circuit boards. Each of the broadside coupling features comprise a terminal portion forming signal coupling features and a feed trace coupled to the terminal portion. A tapered section expanding from the feed trace to the terminal portion of the broadside coupling feature can be employed. The dimensions of the terminal portions are selectively wider than the feed traces to affect RF coupling characteristics. However, the dimensions of the broadside coupling features, and each element thereof, can be selected based on desired operating characteristics.

Dielectric layer 620 comprises a dielectric material and is disposed between circuit boards 610 and 630 within separation distance 601. Although a particular configuration of dielectric layer 620 is shown in view 600, it should be understood that other configurations are possible. For example, small sections of dielectric material might only be deposited between terminal ends of the broadside coupling features, or an entire layer of dielectric material might be deposited to a selected thickness to form gap 602. Thus, dielectric layer 620 can be of a selected thickness which might span the entirety of, or only a portion of, separation distance 601 or gap 602 between the broadside coupling features and circuit boards 610 and 630. In some examples, dielectric layer 620 is applies on top of one or more of the broadside coupling features. Other examples have broadside coupling features embedded into the material of dielectric layer 620.

Also, not shown in FIG. 6, but circuit boards 610 and 630 can include windowed cutouts into internal conductive plane layers configured to provide isolation of the broadside coupling features, among other benefits. The conductive plane layers can have windowed cutouts of decreasing size with relation to the broadside coupling features of circuit boards 610 and 630. These cutouts are coupled through conductive vias internal to the circuit boards and form an isolation structure around each broadside coupling feature (broadside coupling features 611 and 631).

Signal routing in circuit boards 610 and 630 (e.g., signal via 612 of circuit board 610 and signal route 632 of circuit board 630) are included to connect other elements to/from the broadside coupling features. Signal vias can span from one external layer of the circuit boards to another external layer, from one external layer to an internal layer, from one internal layer to another internal layer, or any combination thereof including intervening internal/external signal trace routing. For instance, signal route 632 of circuit board 630 can be coupled with both broadside coupling feature 631 on the external top layer of circuit board 630 and connector 636 on the external bottom layer of circuit board 630. Connector 636 may be a connector arrangement mounted or attached to circuit board 630 that allows circuit board 630 to interface with other circuitry or components to provide RF signals to circuit board 630. Some examples have digital (non-RF) signaling coming over connector 636, with RF circuitry located on circuitry board 630, and outputs from such circuitry is routed to individual broadside coupling features. Likewise, signal via 612 of circuit board 610 can be coupled with both broadside coupling feature 611 on the external bottom layer of circuit board 610 and connector 616 on the external top layer of circuit board 610. Connector 616 may also be a connector arrangement mounted or attached to circuit board 610 that allows circuit board 610 to interface with RF components, for example. It follows that a signal can be carried from connector 636 to broadside coupling feature 631, conveyed across gap 602 to broadside coupling feature 611, and carried further to RF components coupled to connector 616.

Each of circuit boards 610 and 630 can be physically coupled with or attached to enclosure elements 650 and 651, respectively, via one or more attachment features. Structurally, the circuit boards and enclosure elements may be attached using alignment pins and holes, clasps or fastening mechanisms, adhesives, magnetic features, or the like. Each of enclosure elements 650 and 651 not only provides protection for circuit boards 610 and 630 and other internal components but also planar alignment of the circuit boards and corresponding broadside coupling features. Enclosure elements 650 and 651 can comprise alignment gaskets (gaskets 617 of enclosure element 650 and gaskets 637 of enclosure element 651) to help achieve planar alignment and positioning of a respective circuit board while preventing any portion of the circuit boards to bend or sag. This arrangement can take up tolerance variation between the circuit boards and enclosure elements, and maintain a desired stack-up, vertical alignment, or planar arrangement sufficient to meet desired tolerances and gapping between broadside coupling features. Each of the gaskets may be a conductive, non-conductive, or a partially-conductive gasket. Conductive or partially-conductive materials include metal impregnated rubber, a spring/spiral gasket, conductive putty, conductive adhesive, conductive tape, or other similar features. The gaskets can be affixed to the enclosure elements using an adhesive, self-adhering properties, or another attachment method.

Enclosure elements 650 and 651 can then be coupled together using similar or different attachment features. As an example, view 600 demonstrates alignment pins 640 between enclosure elements 650 and 651. However, magnetic elements, adhesives, fasteners or clasps, or the like can be included to achieve alignment and coupling of enclosure elements 650 and 651. When coupled together, enclosure elements 650 and 651 provide planar alignment between circuit boards 610 and 630 and each of the broadside coupling features, protection of circuit boards 610 and 630 and elements thereof, and electrical isolation of the elements from external environments. Magnetic elements positioned nearby the broadside coupling features (e.g., magnetic elements 615 and 635) provide further planar alignment between pairs of broadside coupling features to ensure desired overlap of the broadside coupling features of the circuit board traces without undershoot or overshoot and within the desired x and y planes of coordinate frame 690, as well as maintain a vertical or z-axis stackup distance between broadside coupling features. Regular arraying of the magnetic elements to correspond with each set of broadside coupling features also allows gap 602 between each of the sets of broadside coupling features to be consistent, which allows for improved RF signal coupling, reduced losses and manufacturing errors, and other benefits despite possible warping, sag, or other dimensional and structural inconsistencies of the circuit boards.

Figure 7:
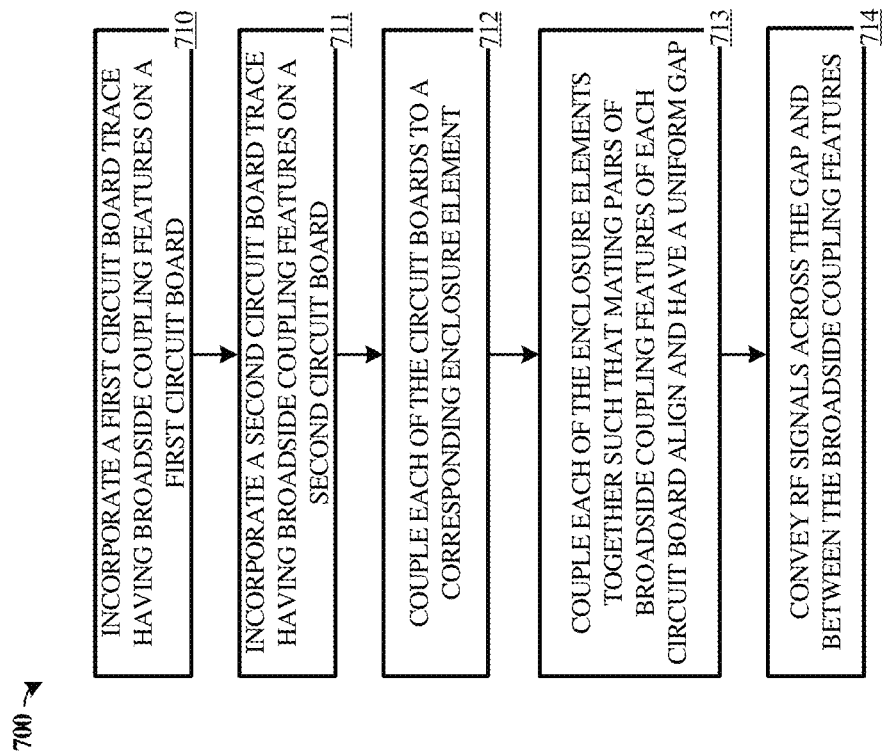
FIG. 7 illustrates an example method of assembling a system comprising circuit boards with broadside coupling features used in an implementation.

FIG. 7 illustrates an example method of assembling a broadside coupling system, such as the system of FIG. 6 and its various components. FIG. 7 includes operations 700, which reference elements of FIG. 6, although the operations can be applied to elements from other Figures.

In operation 710, a first circuit board trace having broadside coupling features is incorporated on a first circuit board (e.g., circuit board 610). Circuit board 610 comprises multiple layers formed from one or more circuit board traces, substrates, conductive plane layers, and vias, among other elements. The first circuit board trace can be etched into, printed on, affixed to, or embedded in, a layer (e.g., internal or external) of circuit board 610. The first circuit board trace can comprise a terminal portion having broadside coupling features 611, a feed trace, and a tapered section expanding a width of the feed trace to a width of the terminal portion. In some instances, dielectric layer 620 can be included on a layer of circuit board 610 around or on the first circuit board trace.

In operation 711, a second circuit board trace having broadside coupling features 631 is incorporated on a second circuit board (e.g., circuit board 630). Circuit board 630 also comprises multiple layers formed from one or more circuit board traces, substrates, conductive plane layers, and vias, among other elements. The second circuit board trace can be etched into, printed on, affixed to, or embedded in, a layer (e.g., internal or external) of circuit board 630. The second circuit board trace can comprise a terminal portion having broadside coupling features 631, a feed trace, and a tapered section expanding a width of the feed trace to a width of the terminal portion.

In operation 712, each of circuit boards 610 and 630 are coupled to corresponding enclosure elements 650 and 651, respectively. The circuit boards can be physically coupled or attached to enclosure elements 650 and 651, respectively, via one or more attachment features. For example, the circuit boards and enclosure elements may be attached using alignment pins and holes, clasps or fastening mechanisms, adhesives, magnetic features, or the like. Each of enclosure elements 650 and 651 not only provides protection for circuit boards 610 and 630 but also planar alignment of the assemblies and broadside coupling features of the assemblies. Enclosure elements 650 and 651 can include gaskets (gaskets 617 of enclosure element 650 and gaskets 637 of enclosure element 651) to help ensure desired stackup/planar alignment and positioning of a respective circuit board while reducing bending or sag of the circuit boards. This arrangement can maintain a desired stack-up, x/y/z alignment, or planar arrangement sufficient to meet desired tolerances and gapping between broadside coupling features. Also, magnetic elements can provide assembly alignment between enclosure elements 650 and 651, which can further align magnetic elements associated with each broadside coupling set.

In operation 713, enclosure elements 650 and 651 are coupled together such that circuit boards 610 and 630 align in proximity and in a planar configuration with a desired planarity in gap 602 between broadside coupling features 611 and 631. Alignment in proximity can refer to a desired distance between broadside coupling features. Enclosure elements 650 and 651 can be coupled together using similar or different attachment features from operation 712. As an example, alignment pins 640 can be used between enclosure elements 650 and 651. However, magnetic elements, adhesives, fasteners or clasps, or the like can be included to achieve alignment and coupling of enclosure elements 650 and 651. When coupled together, enclosure elements 650 and 651 provide alignment and desired spacing between circuit boards 610 and 630 and each of the broadside coupling features. Enclosure elements 610 and 630 can also provide mechanical protection, mechanical/electrical isolation, and electrical/RF/EMI sealing of the coupled assemblies from external environments. Once in an aligned configuration, magnetic elements positioned nearby the broadside coupling features (magnetic elements 615 and 635) provide further planar alignment between pairs of broadside coupling features to ensure desired overlap of the broadside coupling features of the circuit board traces without undershoot or overshoot and within the desired x and y planes of coordinate frame 690, as well as maintain a vertical or 'z' stackup distance between broadside coupling features. The magnetic elements also allow for a consistent gap 602 between each of the pairs of broadside coupling features, which may allow for improved RF signal coupling, reduced losses, and other benefits.

In operation 714, broadside coupling features 611 and 631 convey RF signals across gap 602 between the features of circuit boards 610 and 630. In an instance, the feed trace of the second circuit board trace of circuit board 630 is configured to obtain RF signals from an RF source coupled to connector 636 (or another connector) located on a layer of circuit board 630. The feed trace can carry the RF signals through the tapered section to broadside coupling features 631, which can then convey the RF signals across gap 602. Broadside coupling features 611 of circuit board 610 can obtain the RF signals and pass the signals through the tapered section and the feed trace of the first circuit board trace. The feed trace of the first circuit board trace can be coupled with connector 616 (or another connector) on a layer of circuit board 610. Connector 616, a connector arrangement mounted or attached to circuit board 610, may provide the RF signals to RF transmit/receive circuitry coupled with connector 616. In such instances, the RF signals can be carried through the circuit board assemblies using vias and routes/traces (signal via 612 and route 632) that can span from one external layer of the circuit boards to another external layer, from one external layer to an internal layer, from one internal layer to another internal layer, or any combination thereof. Thus, circuit boards 610 and 630 can function as a contactless or connector-less RF interconnect between devices, systems, or the like coupled to the circuit board assemblies.

Other methods or sequences of assembling such an RF interconnect assembly capable of broadside coupling can be accomplished using similar components, different components, or any combination thereof. For example, the components of the RF interconnect assembly can be manufactured by machining, subtractive machining techniques, 3D printing or additive manufacturing techniques, injection molding techniques, or casting, including combinations thereof. Each component can be 3D printed as singular workpieces or can be machined/cast from separate workpieces. Various combinations of assembly are contemplated and need not be discussed thoroughly for the sake of brevity. The discussion of FIG. 7 might include the assembly of a single broadside-coupled set of circuit board traces. However, schemes with multiple circuit board traces on a circuit board assembly, where each are individually coupled with one of multiple circuit board traces of another assembly of broadside coupling features, are contemplated by this disclosure.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The various materials and manufacturing processes discussed herein are employed according to the descriptions above. However, it should be understood that the disclosures and enhancements herein are not limited to these materials and manufacturing processes and can be applicable across a range of suitable materials and manufacturing processes. Thus, the descriptions and figures included herein depict specific implementations to teach those skilled in the art how to make and use the best options. For the purpose of teaching inventive principles, some conventional aspects have been simplified or omitted. Those skilled in the art will appreciate variations from these implementations that fall within the scope of this disclosure. Those skilled in the art will also appreciate that the features described above can be combined in various ways to form multiple implementations.

What is claimed is:

1. An apparatus, comprising:
broadside coupling features comprising circuit board traces having terminal portions configured to convey radio frequency signals over a gap between the terminal portions;
conductive plane layers having cutouts of decreasing size with relation to the terminal portions that form an isolation structure; and
a dielectric material positioned within the gap.

2. The apparatus of claim 1, wherein the circuit board traces correspond to separate circuit boards separated by the gap, and wherein the broadside coupling features carry the radio frequency signals between the separate circuit boards.

3. The apparatus of claim 2, wherein the broadside coupling features comprise feed traces coupled by a tapered section to the terminal portions to expand a width of the feed traces to a width of the terminal portions, wherein the width of the terminal portions is selected based on a desired operating characteristic of the broadside coupling features.

4. The apparatus of claim 2, wherein each of the separate circuit boards comprises one or more of the conductive plane layers having corresponding cutouts of decreasing size with relation to the terminal portions that form an associated isolation structure within each of the separate circuit boards and maintain a target impedance for the broadside coupling features.

5. The apparatus of claim 2, wherein internal layers of ones of the separate circuit boards are connected by isolation vias configured to provide radio frequency isolation of the broadside coupling features from additional broadside coupling features of the separate circuit boards.

6. The apparatus of claim 2, wherein each of the separate circuit boards comprise magnetic elements configured to magnetically couple and provide at least planar alignment between the broadside coupling features.

7. The apparatus of claim 2, wherein each of the separate circuit boards is mounted to enclosure elements by attachment features; and
wherein the enclosure elements, when coupled together, are configured to provide alignment between the broadside coupling features.

8. The apparatus of claim 7, wherein each of the enclosure elements comprises one or more gaskets affixed to a portion of the enclosure elements and is configured to provide stackup alignment between the separate circuit boards.

9. The apparatus of claim 1, wherein at least one among a thickness and material composition of the dielectric material is selected based at least on a desired operating characteristic of the broadside coupling features.

10. A system, comprising:
a first circuit board with a broadside coupling feature comprising a first circuit board trace having a first terminal portion and first conductive plane layers having cutouts of decreasing size with relation to the first terminal portion that form a first isolation structure within the first circuit board;
a second circuit board with a broadside coupling feature comprising a second circuit board trace having a second terminal portion and second conductive plane layers having cutouts of decreasing size with relation to the second terminal portion that form a second isolation structure within the second circuit board;
a dielectric material positioned within a gap between the first terminal portion and the second terminal portion; and
wherein the broadside coupling features of the first circuit board and the second circuit board are configured to convey radio frequency signals over the gap.

11. The system of claim 10, wherein each of the first circuit board trace and the second circuit board trace comprises a feed trace coupled with a tapered section to a corresponding terminal portion to expand a width of the feed trace to a width of the corresponding terminal portion, wherein the width of the first terminal portion and the second terminal portion is selected based on a desired operating characteristic of the broadside coupling features.

12. The system of claim 10, wherein the first isolation structure and the second isolation structure maintain a target impedance for the broadside coupling features.

13. The system of claim 10, wherein internal layers of ones of the first circuit board and the second circuit board are connected by isolation vias configured to provide radio frequency isolation of the broadside coupling features of the first circuit board and the second circuit board from additional broadside coupling features of the first circuit board and the second circuit board.

14. The system of claim 10, wherein each of the first circuit board and the second circuit board comprise magnetic elements configured to magnetically couple and provide at least planar alignment between the broadside coupling features of the first circuit board and the second circuit board.

15. The system of claim 10, wherein each of the first circuit board and the second circuit board is mounted to enclosure elements by attachment features; and
wherein the enclosure elements, when coupled together, are configured to provide alignment between the broadside coupling features of the first circuit board and the second circuit board.

16. The system of claim 15, wherein each of the enclosure elements comprises one or more gaskets affixed to a portion of the enclosure elements and is configured to provide stackup alignment between the first circuit board and the second circuit board.

17. The system of claim 10, wherein at least one among a thickness and material composition of the dielectric material is selected based at least on a desired operating characteristic of the broadside coupling features.

18. A system, comprising:
   circuit boards separated by a gap, wherein each of the circuit boards comprise:
      an array of broadside coupling features comprising circuit board traces having terminal portions configured to convey radio frequency signals over the gap between the terminal portions; and
      magnetic elements configured to planarly align corresponding pairs of broadside coupling features of the circuit boards;
      one or more conductive plane layers having cutouts of decreasing size with relation to the terminal portions that form an isolation structure within each of the circuit boards; and
   a dielectric material positioned within the gap.

19. The system of claim 18, wherein the circuit board traces comprise feed traces coupled using a tapered section to the terminal portions to expand a width of the feed traces to a width of the terminal portions, wherein the width of the terminal portions is selected based on a desired operating characteristic of the broadside coupling features.

20. The system of claim 18, wherein the isolation structure within each of the circuit boards maintain a target impedance for the broadside coupling features.

* * * * *